(12) United States Patent
Blakes et al.

(10) Patent No.: US 8,305,726 B2
(45) Date of Patent: Nov. 6, 2012

(54) METHOD FOR PROGRESSIVELY INTRODUCING CURRENT INTO A SUPERCONDUCTING COIL MOUNTED ON A FORMER

(75) Inventors: Hugh Alexander Blakes, Longworth (GB); Russell Peter Gore, Abingdon (GB); Marcel Jan Marie Kruip, Oxford (GB); Robert Slade, Witney (GB)

(73) Assignee: Siemens Plc, Frimley, Camberley (GB)

( * ) Notice: Subject to any disclaimer, the term of this patent is extended or adjusted under 35 U.S.C. 154(b) by 443 days.

(21) Appl. No.: 12/707,514

(22) Filed: Feb. 17, 2010

(65) Prior Publication Data

US 2010/0226058 A1  Sep. 9, 2010

(30) Foreign Application Priority Data

Mar. 3, 2009 (GB) .................................. 0903583.3

(51) Int. Cl.
*H01F 6/00* (2006.01)
*H01H 47/00* (2006.01)
(52) U.S. Cl. ........................................ 361/141; 335/216

(58) Field of Classification Search ................... 361/141; 335/216

See application file for complete search history.

(56) References Cited

U.S. PATENT DOCUMENTS

| 6,150,912 A | 11/2000 | Elgin, II et al. |
| 2005/0111159 A1 | 5/2005 | Knight |
| 2006/0284711 A1* | 12/2006 | Atkins et al. ................... 335/216 |
| 2008/0074110 A1* | 3/2008 | Mito et al. ..................... 324/248 |

FOREIGN PATENT DOCUMENTS

| GB | 2 355 537 A | 4/2001 |
| JP | 2007-50431 A | 3/2007 |
| JP | 2007-214466 A | 8/2007 |

OTHER PUBLICATIONS

Great Britain Search Report dated Jun. 10, 2009 (Two (2) pages).

* cited by examiner

*Primary Examiner* — Jared Fureman
*Assistant Examiner* — Scott Bauer
(74) *Attorney, Agent, or Firm* — Crowell & Moring LLP

(57) ABSTRACT

A method for progressively introducing current into, or removing current from, a superconducting coil mounted on a former, in which the coil vibrates relative to the former.

20 Claims, 3 Drawing Sheets

METHOD FOR PROGRESSIVELY INTRODUCING CURRENT INTO A SUPERCONDUCTING COIL MOUNTED ON A FORMER

The present invention relates to superconducting magnet coils mounted on formers. The present invention will be described with particular reference to cylindrical superconducting magnets, but may be applied to any arrangement including at least one superconducting coil mounted on a former. The invention particularly relates to methods and equipment for reducing the superconducting magnet's tendency to quench as current is introduced into the superconducting coil(s).

FIGS. 1A-1B illustrate cross-sectional and axial sectional views, respectively, of a conventional cylindrical superconducting magnet arrangement for a nuclear magnetic resonance (NMR) or magnetic resonance imaging (MRI) system. A number of coils 34 of superconducting wire are wound onto a former 1 to form a cylindrical magnet structure. The resulting assembly is housed inside a cryogen vessel 2 which is at least partly filled with a liquid cryogen 2a at its boiling point. The coils 34 are thereby held at a temperature below their critical temperature. Commonly, the liquid cryogen 2a is helium, and this holds the coils 34 at a temperature of about 4K.

The former 1 is typically constructed of aluminium, which is machined to ensure accurate dimensions of the former, in turn ensuring accurate size and position of the coils which are wound onto the former. Such accuracy is essential in ensuring the homogeneity and reliability of the resultant magnetic field. Superconducting magnets may quench due to even a small amount of movement of a coil. The formers must therefore be very rigid and firmly retained in position.

The cylindrical magnet is essentially symmetrical about axis AA. References herein to "axial" and "radial" directions are determined with reference to this axis.

Also illustrated in FIGS. 1A-1B are an outer vacuum container 4 and thermal shields 3. As is well known, these serve to thermally isolate the cryogen vessel 2 from the surrounding atmosphere. Insulation 5 may be placed inside the space between the outer vacuum container and the thermal shield. The available inside diameter 4a of the cylindrical magnet arrangement is required to be of a certain minimum dimension to allow patient access.

When the magnet is brought into service, current is progressively introduced into the coils 34 in a process known as "ramping-up". As the current is introduced, magnetic fields are produced. The magnetic fields act on the coils due to the electrical current flowing in them, which results in an axial force on each coil. Radial forces are also generated, which tend to increase or reduce the diameter of each coil. This may cause a coil to become loose on its former, making movement more likely, or may tighten the coil onto the former, possibly resulting in frictional heating to the coil. Due to the relative dimensions of the coils, the axial forces are typically only troublesome on the axially outermost coils. Axial forces may also be significant on the shield coils, shown as radially outermost coils in FIG. 1B.

These forces increase as the current through the coils increases. As the current in the coils increases, the increasing forces acting on the coils may cause the coils to move. The coils are under pressure, bearing against a part of the former. This is generally the axially inner surface of the former, for each coil. These surfaces will be termed "thrust faces", and are shown at 36 in FIG. 1B.

As radial forces increase, the coil changes diameter, for example becoming looser on the former. The coil is also firmly pressed against the thrust face 36 by axial forces. If the coils move while forced against the thrust face, or if they move into contact with the thrust face, heat will be released at the interface. This heat may be sufficient to cause the coil to quench. Movement of the coil over the thrust face is typically "stick-slip"—a stress will build up between the coil and the former until it is enough to overcome the "stiction" holding the coil in place, and the result will be a sudden movement, which causes heat to be generated by friction as the coil moves, and which will induce currents in the material of the coil, due to the coil's movement through a magnetic field. The resulting heat may be sufficient to induce a quench in the coil.

If a quench occurs, the superconducting coil suddenly becomes resistive, and the current through it causes a large amount of heat to be released. This boils off large quantities of cryogen, and the ramping process must begin again. It has therefore been known for some time that the problem of coil movement during ramping should be addressed.

In one known approach, very low friction surfaces are interposed between the coil and the former, known as "slip planes". These surfaces do not prevent a coil from moving, but, while the coil may move, it moves easily without generating significant frictional heating. The coil may move progressively, rather than in a stick-slip manner. Such arrangements have, however, been found to be unreliable in use. Small imperfections or impurities can render the arrangement ineffective.

In another known approach, a buffer layer is attached to the coil itself, interposed between the coil and the former. Typically, such a buffer layer may be a fibreglass reinforced resin layer, formed during resin impregnation of the coil. The buffer layer does not seek to prevent the stick-slip motion of the coil, but rather aims to absorb and dissipate the generated heat, rather than allowing the heat to raise the temperature of a small region of the coil. The need to provide space for such buffer layers may compromise the electromagnetic design of a magnet.

JP2007050431 discusses methods and equipment for reducing stick-slip in a drawing tube for paper.

It is an object of the present invention to provide a method and apparatus which reduces the tendency of stick-slip in superconducting magnet coils as they are being ramped to full current.

Accordingly, the present invention provides methods and apparatus as defined in the appended claims.

The above, and further, objects, advantages and characteristics of the present invention will become more apparent from consideration of the following description of certain embodiments, given by way of examples only, in conjunction with the accompanying drawings, wherein.

The present invention relies upon the mechanical vibration of the coil during ramping, on the principle that as the coil is vibrated, and movement caused by forces acting on the coil during ramping will occur as a larger number of small movements, each insufficient to cause a quench, rather than in a smaller number of larger movements, which may be sufficient to cause a quench.

In some embodiments of the present invention, an actuator, such as a piezo-electric element, is provided. The actuator is operated to introduce relative vibration between the coil and the thrust face during ramping. This vibration facilitates movement between the coil and the former, and so releases stress in a controlled manner, as many small movements rather than allowing stress to build up and be released in a relatively large stick-slip event as in the prior art. The stress will be released in a larger number of low-energy events, each insufficient to induce quench in the superconducting coil.

Figure 2A:
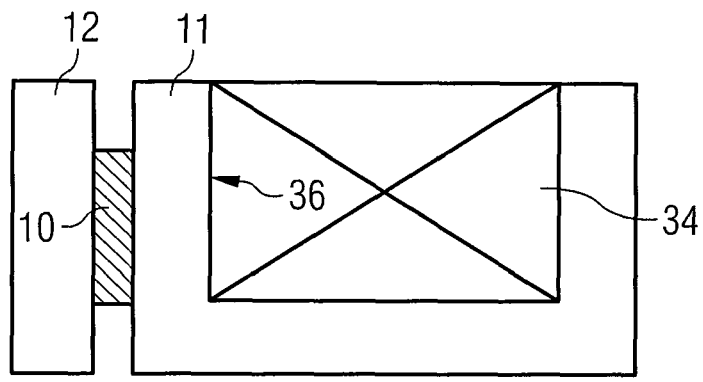
FIGS. 2A-2C show schematic cross-sections of the placement of actuators according to certain embodiments of the present invention.

In one embodiment of the invention, illustrated in FIG. 2A, a piezoelectric actuator 10 may be placed on a coil former 11, so as to vibrate the thrust face. In this arrangement, one side of the actuator 10 is placed on the outside of the former 11, near the thrust face. A mass 12, for example a ring of stainless steel, is placed on the other side of the actuator. As the actuator vibrates, the inertia of the mass ensures that some vibrations are applied to the thrust face 36 of the former.

Figure 2B:
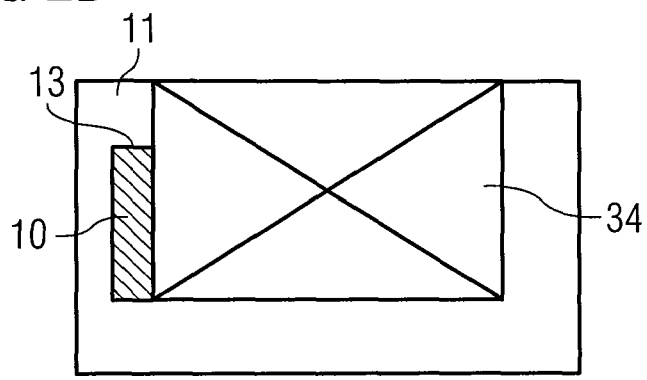

In another embodiment shown in FIG. 2B, the actuator 10 may be placed within the former, adjacent to the coil 34. To avoid the whole axial force being applied to the actuator, the actuator may be positioned in a recess 13 in the thrust face of the former. This recess should be deep enough to accommodate the actuator in its relaxed state, but not deep enough to accommodate the actuator in its energised state. This will allow the actuator to cause vibrations between the thrust face and the coil, but does not place the axial force on the actuator in steady state.

Figure 2C:
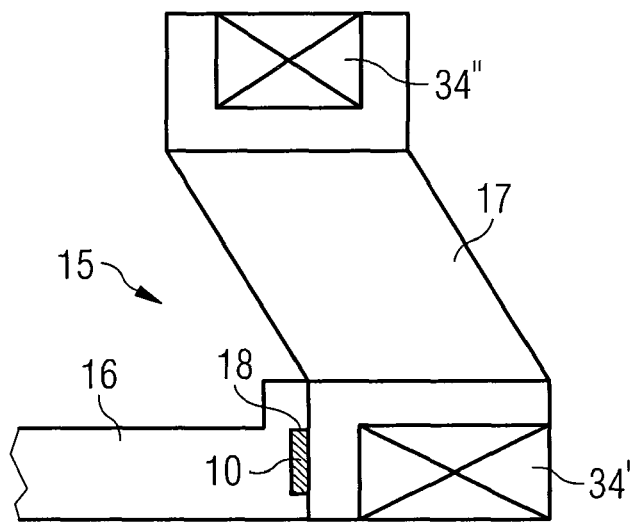

FIG. 2C shows a third embodiment, in which the former 15 is assembled from at least three pieces, a central tubular piece 16, and two annular end pieces 17. The end pieces each carry an axially outermost coil 34' of the main magnet and a shield coil 34". In this arrangement, the actuator 10 is positioned between the tubular piece 16 and an annular end piece 17. The actuator 10 may be positioned in a recess 18 formed in at least one of the opposing faces of the tubular piece and the annular end piece. This recess should be deep enough to accommodate the actuator in its relaxed state, but not deep enough to accommodate the actuator in its energised state. This will allow the actuator to cause vibration of the thrust face, but does not place significant force on the actuator in steady state.

In any arrangement, it is expected that several actuators will be required, distributed around the circumference of the coil in question. For example, six actuators may be provided, evenly distributed around the circumference of each end coil. Fewer or more actuators may be employed, and trial-and-error may be needed to find the most appropriate number in any particular arrangement. Even a single actuator will provide some of the advantages of the present invention.

Figure 3:
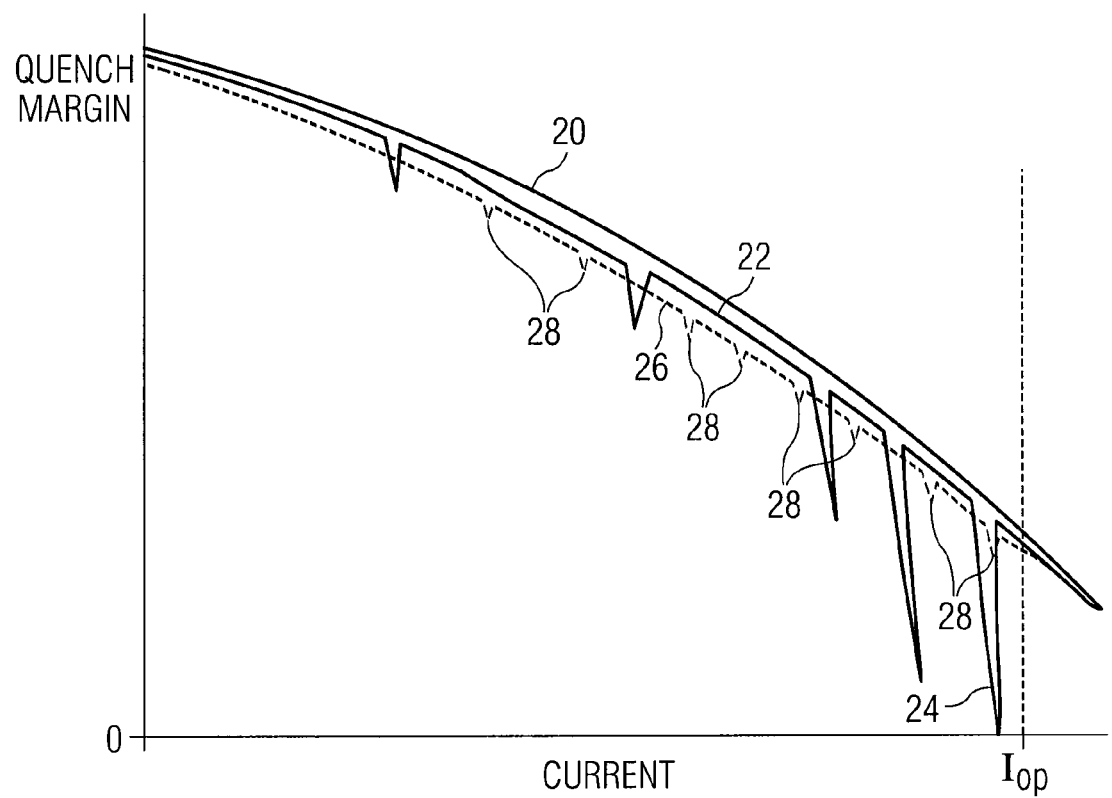
FIG. 3 illustrates comparative results of the present invention against the prior art.

FIG. 3 illustrates results of using actuator(s) during ramping according to the present invention. The increasing current is shown along the x-axis, from zero to the target operating current Iop. The y-axis represents the quench margin in energy terms: the amount of further energy required to induce a quench in the coil. The quench margin reduces as current increases, since the increase in magnetic flux density within the superconductor, associated with the increasing current, will reduce the quench margin.

Curve 20 represents the theoretical, ideal, case, where no stick-slip interaction takes place. The quench margin decreases progressively with increasing current.

Curve 22 represents a conventional ramping procedure, in which a number of significant stick-slip events occur, each releasing energy, heating the coil and significantly reducing the quench margin. At some events, such as shown at 24, the quench margin falls to zero, and a quench event will occur.

Curve 26, on the other hand, represents the evolution of quench margin in a coil equipped with a vibrating actuator according to the present invention. As ramping progresses, a relatively large number of small stick-slip events can be observed, labelled 28. Each of these events releases some heat energy and reduces the quench margin, but not by a significant amount. The coil current reaches its target value Iop without the quench margin ever approaching zero.

The frequency of vibration of the actuator should preferably be chosen to induce resonance in the former, to distribute the vibration effect across a whole coil, and preferably the whole magnet, rather than to create just a single vibrating spot. A preferred manner in which to achieve such resonant vibration would be to position a number of actuators at or near positions corresponding to anti-nodes of vibration of a selected mode of oscillation in the former, corresponding to a chosen resonant frequency, at which the actuators will be operated. It is anticipated that the actuators will introduce vibration at a frequency of between 100-10000 Hz, for typical cylindrical magnets for MRI imaging.

Figure 1A:
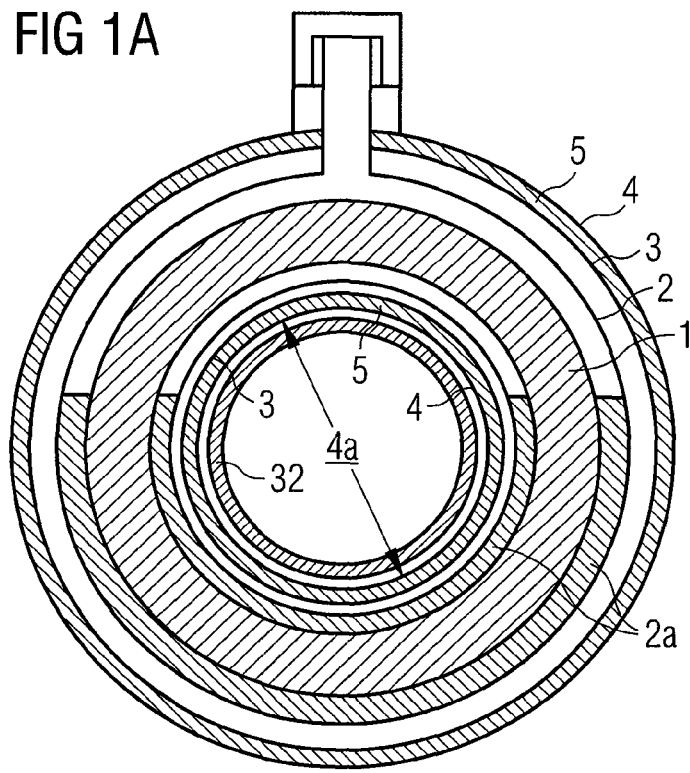
FIGS. 1A-1B show schematic radial and axial cross-sections, respectively, of a cylindrical superconducting magnet suitable for improvement according to the present invention.
Figure 1B:
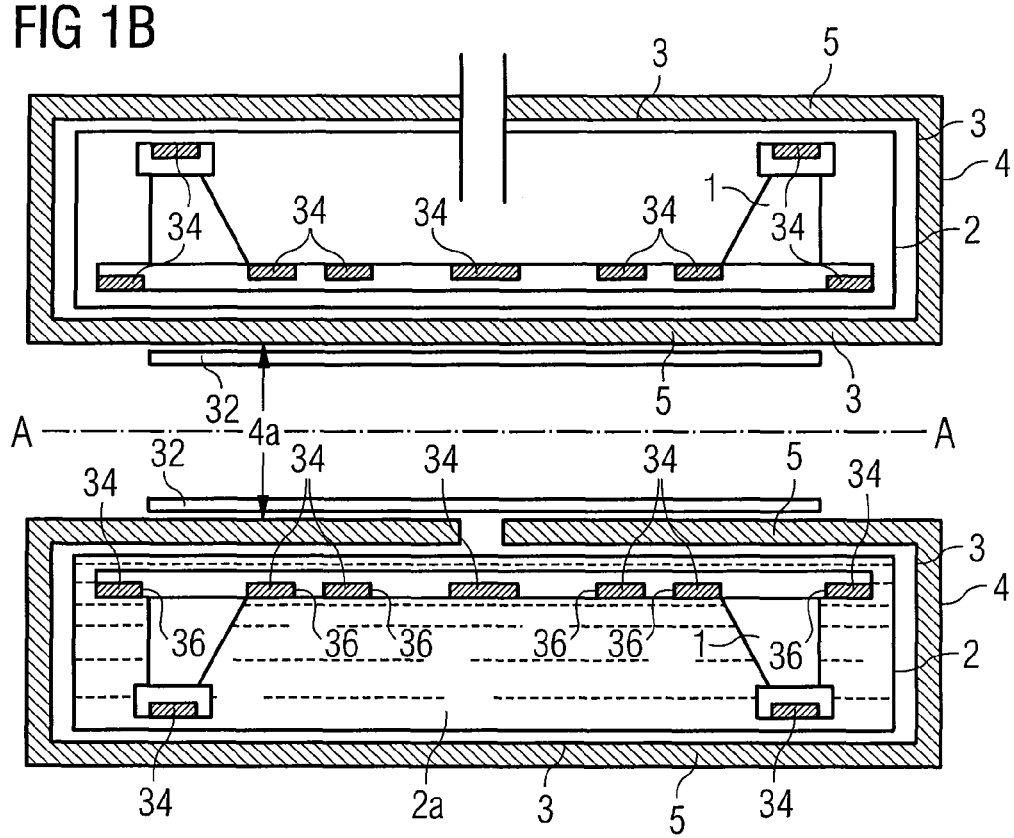

While the above-described embodiments employ an electrically actuated vibration transducer, the present invention may be realised using vibrations induced in the magnet coils by an external magnetic field. As is well known in the art, NMR or MRI imaging systems are provided with gradient coils. The gradient coils provide rapidly changing magnetic field in three dimensions x, y, z, to enable images to be constructed. A gradient coils assembly 32 is shown in FIG. 1B. The gradient coil assembly typically includes respective coil set for producing time-variant magnetic gradients in each of the orientations x, y, z.

By applying an oscillating current to at least one of the gradient coils mechanical vibration may be induced in the coils 34 of the superconducting magnet by interaction of the magnetic field of the coils 34 with the oscillating magnetic field generated by the gradient coil(s). This vibration will have much the same effect as the vibration induced by the arrangements mentioned above, but such an arrangement has the advantage that no modifications need to be made to the magnet. The gradient coils themselves are used as the vibration actuator. Indeed, all that is required is to apply an oscillating current of an appropriate frequency and magnitude to a gradient coil, as the superconducting coils 34 are ramped. The mechanical vibrations induced in the superconducting coil by the oscillating magnetic field of the gradient coil will ensure that no significant stick-slip events will take place, and evolution of the quench margin as ramping progresses will essentially follow a path similar to curve 24 shown in FIG. 2.

Any of the x, y and z gradient coils may be used as an actuator as described above, on condition that the magnetic flux generated by the selected gradient coil must link the magnet coils 34 to induce the required vibration forces and motion. That is to say, the selected gradient coil and the magnet coils 34 must have some mutual inductance. This criterion may most simply be met using z-gradient coils, in current arrangements.

In normal circumstances, such magnetic coupling between gradient coils and magnet coils is undesirable, and gradient shielding coils are typically provided to reduce the magnetic coupling. In addition, the gradient and magnet coils are typically located on a common magnetic centre, to further reduce magnetic coupling. For operation of the present invention, increased magnetic coupling may be intentionally and temporarily introduced by temporarily axially displacing the gradient coil relative to the magnet by a few millimetres, and/or by deactivating the gradient shield coils, for example by electrically shorting them out.

Alternatively, the gradient shield coil may be used as the actuator, by applying an oscillating current of suitable frequency and magnitude. The gradient shield coils are typically placed radially outside of the gradient coils themselves, and so may be more effectively coupled with the magnet coils 34.

Numerous other arrangements may be employed for introducing relative vibration between the coils and the former. For example, arrangements may be made, for example, using the gradient coils, to induce eddy currents in the material of the thermal radiation shield 3. These eddy currents will cause vibration of the thermal radiation shield, due to interaction with the magnetic field of the magnet. These vibrations will propagate to the former, and introduce the required relative vibration between the former and the coils.

In another alternative, an electrically conductive mass may be caused to mechanically oscillate within the magnetic field of the magnet. For example, a ring or block of aluminium may be mechanically driven to-and-fro within the bore of the magnet, or about the axis A-A, outside of the bore of the magnet. The eddy currents induced in the electrically conductive mass generate magnetic fields which interfere with the magnetic fields generated by the coils, and put forces on the coils, causing them to vibrate on the former. Rather than a to-and-fro motion, a conductive block may be made to rotate about the axis A-A, within the bore of the magnet, with similar effects.

In a variation of this method, conductive blocks may be caused to oscillate to-and-fro, or about the axis A-A, outside of the bore of the magnet. Such motion may in turn generate eddy currents within the shield coils, causing them to oscillate, and propagate vibrations to the former and the coils as mentioned above.

In any embodiment of the present invention, it is not necessary for the vibrations to be applied to the coil or the former continuously. It may be sufficient to apply a burst of vibrations, for example once every second, or every five seconds, to cause any built-up stress to be released before it becomes so great that a stick-slip event causing a quench is possible.

While the present invention has been described with reference to applying vibration to a coil during ramping-up, the invention may be similarly applied during ramping-down. Ramping-down is the name given to the gradual removal of current from the superconducting magnet. As the current in the magnet reduces, the axial and radial forces acting on the coil will reduce. This will allow the coil to relax, to some extent, towards its position prior to ramping-up. During this procedure, at least parts of the coil may move axially away from the thrust face, and may tighten onto the former. These movements may still induce a quench, even with the reducing level of current flowing in the coils. By operating the vibration actuators during ramp-down, such quench events may be avoided.

The invention claimed is:

1. A method for progressively altering the magnitude of a current flowing in a superconducting coil mounted on a former, characterized in that the method includes causing mechanical vibration of the coil relative to the former as the magnitude of the current is altered.

2. A method according to claim 1 wherein the mechanical vibration is introduced by action of an external oscillating magnetic field on the superconducting coil.

3. A method according to claim 1, wherein a vibrating actuator, is provided, located in contact with the former, and is controlled to cause said mechanical vibration.

4. A method according to claim 3, wherein a plurality of vibrating actuators are provided at locations on the former, and, when in use, induce resonant vibration of the former.

5. A method according to claim 1 wherein the vibrations are intermittently caused while the magnitude of the current is altered.

6. A method according to claim 3, wherein the actuator is positioned between the coil and the former, within a recess.

7. A method according to claim 3, wherein the actuator is positioned between the former and a mass providing inertia to cause the actuator to vibrate the thrust face of the former.

8. A method according to claim 3, wherein the former is composed of a tubular piece, having an annular piece attached to one end, and the actuator is positioned between the tubular piece and the annular piece.

9. A method according to claim 1 wherein the mechanical vibration is introduced by inducing eddy currents in the material of the thermal radiation shield, which eddy currents cause vibration of the thermal radiation shield, due to interaction with the magnetic field of the magnet, the vibration of the thermal radiation shield propagating to the former, thereby introducing the required vibration of the coil relative to the former.

10. A method according to claim 1 wherein the mechanical vibration is introduced by causing an electrically conductive mass to mechanically oscillate within the magnetic field of a magnet comprising the coil.

11. A method according to claim 10, wherein a conductive mass is mechanically driven to-and-fro within a bore of the magnet.

12. A method according to claim 10, wherein a conductive mass is rotated about an axis of the coil.

13. Apparatus for causing mechanical vibration of a superconducting coil relative to a former upon which the coil is mounted, comprising a vibrating actuator, located in contact with the former, and controllable to cause said mechanical vibration.

14. Apparatus according to claim 13, wherein a plurality of vibrating actuators are provided at locations on the former, and, when in use, induce resonant vibration of the former.

15. Apparatus according to claim 13, wherein the or each actuator is positioned between the coil and the former, within a corresponding recess.

16. Apparatus according to claim 13, wherein the or each actuator is positioned between the former and a corresponding mass providing inertia, when in use, to cause the actuator to vibrate the thrust face of the former.

17. Apparatus according to claim 13, wherein the former is composed of a tubular piece, having an annular piece attached to one end, and the or each actuator is positioned between the tubular piece and the annular piece.

18. Apparatus for causing mechanical vibration of a superconducting coil relative to a former upon which the coil is mounted, comprising an electrically conductive mass arranged to mechanically oscillate within the magnetic field of a magnet comprising the coil.

19. Apparatus according to claim 18, wherein the conductive mass is mechanically driven to-and-fro within a bore of the magnet.

20. Apparatus according to claim 18, wherein the conductive mass is rotated about an axis of the coil.

* * * * *